United States Patent
Asuncion et al.

(10) Patent No.: US 11,217,965 B2
(45) Date of Patent: Jan. 4, 2022

(54) FAULT DETECTOR CIRCUIT

(71) Applicant: LITE-ON SINGAPORE PTE. LTD., Singapore (SG)

(72) Inventors: John Julius De Leon Asuncion, Singapore (SG); Tong-Tee Tan, Singapore (SG); Jiaqi Sun, Singapore (SG)

(73) Assignee: LITE-ON SINGAPORE PTE. LTD., Singapore (SG)

( * ) Notice: Subject to any disclaimer, the term of this patent is extended or adjusted under 35 U.S.C. 154(b) by 121 days.

(21) Appl. No.: 16/871,132

(22) Filed: May 11, 2020

(65) Prior Publication Data

US 2020/0395734 A1 Dec. 17, 2020

(30) Foreign Application Priority Data

Jun. 17, 2019 (CN) .......................... 201910521843.9

(51) Int. Cl.
*G01R 31/26* (2020.01)
*H01S 5/068* (2006.01)

(52) U.S. Cl.
CPC ...... *H01S 5/06825* (2013.01); *G01R 31/2635* (2013.01)

(58) Field of Classification Search
CPC . H01S 5/06825; H01S 5/042; G01R 31/2635; G01R 31/00; G01R 31/44; G01M 11/00; H01L 27/32; H01L 27/12; H01L 27/1214; H01L 27/3244; H01L 29/42384; G09G 3/006; G09G 3/32; G09G 3/3208; G09G 3/3233; G09G 2300/0842; G09G 3/36; G09G 3/3655
See application file for complete search history.

(56) References Cited

U.S. PATENT DOCUMENTS

| | | | | |
|---|---|---|---|---|
| 2012/0313536 A1* | 12/2012 | Kim | ..................... | H05B 45/3725 315/186 |
| 2014/0159996 A1* | 6/2014 | Nathan | ................ | G09G 3/3233 345/77 |
| 2016/0081148 A1* | 3/2016 | Liang | ...................... | G01R 31/44 324/414 |
| 2019/0208589 A1* | 7/2019 | Satterfield | .............. | H05B 45/35 |

FOREIGN PATENT DOCUMENTS

CN 101059537 A * 10/2007 ............. H05B 45/58

* cited by examiner

*Primary Examiner* — Son T Le
(74) *Attorney, Agent, or Firm* — Li & Cai Intellectual Property (USA) Office (57) ABSTRACT

A fault detector circuit is provided for detecting or controlling any signal related to a laser emitter in an electronic device. The fault detector circuit includes a first NMOS transistor and a comparator. A drain of the first NMOS transistor is coupled to a first supply voltage through the laser emitter. A gate of the first NMOS transistor is coupled to a control voltage. A source of the first NMOS transistor is grounded. The comparator is coupled to the drain of the first NMOS transistor and a reference voltage. The comparator compares a voltage of the drain of the first NMOS transistor with the reference voltage to generate a first detecting signal for determining whether or not the first supply voltage of the laser emitter needs to be cut off.

15 Claims, 4 Drawing Sheets

FAULT DETECTOR CIRCUIT

CROSS-REFERENCE TO RELATED PATENT APPLICATION

This application claims the benefit of priority to China Patent Application No. 201910521843.9, filed on Jun. 17, 2019 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a fault detector circuit, and more particularly to a fault detector circuit for detecting or controlling any signal related to a laser emitter in an electronic device.

BACKGROUND OF THE DISCLOSURE

When a user uses a smartphone, the user almost always focuses his/her eyes on a display screen at a close range. In order to ensure safety of such use, a VCSEL as a light source of a proximity sensor must be used in compliance with relevant eye safety regulations and additional safety measures, for example, a fault detector circuit disposed within the proximity sensor.

SUMMARY OF THE DISCLOSURE

In response to the above-referenced technical inadequacies, the present disclosure provides a fault detector circuit for detecting a sensor in an electronic device, especially for a proximity sensor with a laser emitter.

In one aspect, the present disclosure provides a sensor which works with a laser emitter in an electronic device. A fault detector circuit is provided for detecting or controlling any signal related to the laser emitter. The fault detector circuit includes a first NMOS transistor and a comparator. The first NMOS transistor has a drain coupled to a first supply voltage through the laser emitter, a gate coupled to a control voltage, and a source grounded. The comparator has an inverting terminal coupled to the drain of the first NMOS transistor and a non-inverting terminal coupled to a reference voltage. Before the laser emitter is driven by the first supply voltage, the first NMOS transistor is turned off by the control voltage, and the comparator compares a voltage of the drain of the first NMOS transistor with the reference voltage to generate a first detecting signal for determining whether or not the first supply voltage of the laser emitter needs to be cut off.

In certain embodiments, the fault detector circuit further includes a first current source coupled to the drain of the first NMOS transistor through a first switch. Before the laser emitter is driven by the first supply voltage, the first switch is turned on such that the first current source provides a current to the drain of the first NMOS transistor.

In certain embodiments, when the voltage of the drain of the first NMOS transistor is lower than the reference voltage, the comparator generates the first detecting signal at a high voltage level such that a digital controller in the fault detector circuit outputs an interrupt signal to a microcontroller in the electronic device according to the first detecting signal to cut off the first supply voltage of the laser emitter.

In certain embodiments, after the laser emitter is driven by the first supply voltage, the first NMOS transistor is turned on by the control voltage, and the comparator continually compares the voltage of the drain of the first NMOS transistor with the reference voltage. When the voltage of the drain of the first NMOS transistor is lower than the reference voltage, the comparator generates the first detecting signal at the high voltage level, such that the digital controller included in the electronic device cuts off the first supply voltage of the laser emitter via the microcontroller included in the electronic device according to the first detecting signal.

In certain embodiments, the fault detector circuit further includes a first current source coupled to the drain of the first NMOS transistor through a first switch. Before the laser emitter is driven by the first supply voltage, the first switch is turned on such that the first current source provides a current to the drain of the first NMOS transistor.

In another aspect, the present disclosure provides a fault detector circuit for detecting an optical sensor which works with a laser emitter in an electronic device. The fault detector circuit includes a switch transistor, a first NMOS transistor, and a comparator. The switch transistor has a first terminal coupled to a first supply voltage. The first NMOS transistor has a drain coupled to a third terminal of the switch transistor through the laser emitter, a gate coupled to a control voltage, and a source grounded. The comparator has an inverting terminal coupled to the drain of the first NMOS transistor and a non-inverting terminal coupled to a reference voltage. Before the laser emitter is driven by the first supply voltage, the first NMOS transistor is turned off by the control voltage, and the comparator compares a voltage of the drain of the first NMOS transistor with the reference voltage to generate a first detecting signal. A digital controller outputs a control signal to the switch transistor and the first NMOS transistor to turn on or turn off the switch transistor and the first NMOS transistor according to the first detecting signal.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The present disclosure provides a fault detector circuit disposed in an IC package of an optical sensor or an extra IC in an electronic device. The fault detector circuit is configured to detect whether or not a short circuit, leakage or other failure occurs in the IC and timely cuts off a voltage supplied by a laser emitter, thereby preventing a user's eyes from being exposed to un-expected laser radiation, wherein the optical sensor can be a proximity sensor and the laser emitter can be a VCSEL. The fault detector circuit is described in following embodiments of the present disclosure, but the present disclosure is not limited thereto.

Figure 1:
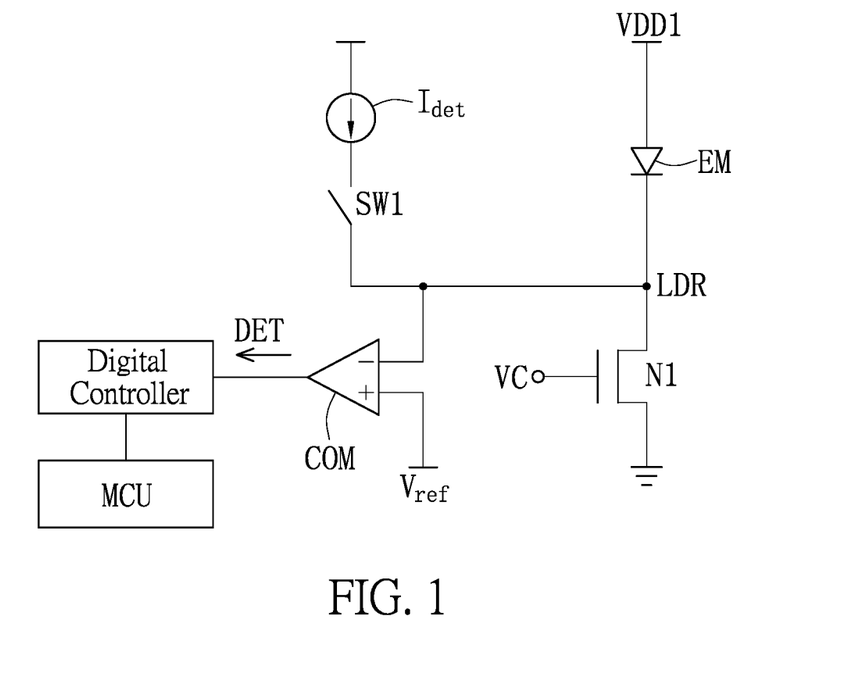
FIG. 1 is a circuit diagram of a fault detector circuit for a laser emitter according to a first embodiment of the present disclosure.

Reference is made to FIG. 1, which is a circuit diagram of a fault detector circuit for a laser emitter according to a first embodiment of the present disclosure.

As shown in FIG. 1, in the embodiment, the fault detector circuit mainly includes a first NMOS transistor N1, a comparator COM, and a first current source Idet. A drain of the first NMOS transistor N1 is coupled to a first supply voltage VDD1 through a laser emitter EM. A gate of the first NMOS transistor N1 is coupled to a control voltage VC. A source of the first NMOS transistor N1 is grounded. An inverting terminal of the comparator COM is coupled to the drain of the first NMOS transistor N1. A non-inverting terminal of the comparator COM is coupled to a reference voltage Vref.

In addition, the first current source Idet is coupled to the drain of the first NMOS transistor N1 through a first switch SW1.

In the embodiment, the fault detector circuit is disposed in the IC package in the electronic device. The sensor has the laser emitter as a light source for a sensing operation. More specifically, in the embodiment, the fault detector circuit is mainly used to detect whether or not a short circuit or leakage occurs in the IC package of the sensor in the electronic device. The following describes how the fault detector circuit in the embodiment detects any fault signal occurs in the IC package of the sensor in the electronic device.

Before the sensor in the electronic device starts to operate, the fault detector circuit in the embodiment detects whether or not a short circuit or leakage occurs in the IC of the sensor, thereby preventing a user's eyes from being exposed to high energy laser radiation of a laser emitter that abnormally operates after the sensor in the electronic device is driven.

Therefore, before the sensor in the electronic device starts to operate, the first NMOS transistor N1 is turned off by the control voltage VC. Then, in order to detect whether or not a short circuit occurs in the IC of the sensor, the comparator COM compares a voltage of the drain of the first NMOS transistor N1 with the reference voltage Vref to generate a first detecting signal DET. A digital controller in the electronic device determines whether or not the first supply voltage VDD1 of the laser emitter EM needs to be cut off by a microcontroller in the electronic device according to the first detecting signal DET. For convenience of explanation, in the embodiment, the reference voltage Vref is exemplified as 0.25V, the first supply voltage VDD1 is exemplified as 3V and a current provided by the first current source Idet is exemplified as 20 mA, but the present disclosure is not limited thereto.

When a short circuit does not occur in the IC of the sensor, a voltage of a node LDR through which the IC of the sensor is connected to the laser emitter EM is reduced to be equal to the first supply voltage VDD1. However, when a short circuit occurs in the IC of the sensor, the voltage of the node LDR through which the IC of the sensor is connected to the laser emitter EM is equal to be a ground voltage that is 0V.

When a short circuit does not occur in the IC of the sensor, the voltage of the node LDR (e.g., 3V) is higher than a reference voltage (e.g., 0.25V). Under this condition, the comparator COM compares the voltage of the node LDR with the reference voltage to output the first detecting signal DET at a low voltage level. It is determined that a short circuit does not occur in the IC of the sensor according to the first detecting signal DET at the low voltage level.

However, when a short circuit occurs in the IC of the sensor, the voltage of the node LDR (e.g., 0V) is lower than the reference voltage (e.g., 0.25V). Under this condition, the comparator COM compares the voltage of the node LDR with the reference voltage to output the first detecting signal DET at a high voltage level. The IC of the sensor outputs an interrupt signal to a microcontroller MCU in the electronic device according to the first detecting signal DET at the high voltage level. The microcontroller MCU cuts off the first supply voltage VDD1 of the laser emitter EM according to the interrupt signal.

In addition, in order to detect whether or not leakage occurs in the IC of the sensor, the first switch SW1 is turned on such that the first current source Idet provides a current to the drain of the first NMOS transistor N1. At this time, when leakage does not occur in the IC of the sensor, the voltage of the node LDR through which the IC of the sensor is connected to the laser emitter EM is equal to the first supply voltage VDD1. However, when leakage occurs in the IC of the sensor, a leakage resistance is formed between the drain of the first NMOS transistor N1 and the source of the first NMOS transistor N1. Under this condition, the voltage of the node LDR through which the IC of the sensor is connected to the laser emitter EM is equal to the leakage resistance multiplied by the current provided by the first current source Idet.

When leakage does not occur in the IC of the sensor, the voltage of the node LDR (e.g., 3V) is higher than the reference voltage (e.g., 0.25V). Under this condition, the comparator COM compares the voltage of the node LDR with the reference voltage to output the first detecting signal DET at a low voltage level. It is determined that leakage does not occur in the IC of the sensor according to the first detecting signal DET at the low voltage level.

When leakage occurs in the IC of the sensor (e.g., the leakage resistance is 1000 ohms), the voltage of the node LDR (e.g., 0.02V) is lower than the reference voltage (e.g., 0.25V). Under this condition, the comparator COM compares the voltage of the node LDR with the reference voltage to output the first detecting signal DET at a high voltage level. The digital controller in the IC of the sensor outputs an interrupt signal to the microcontroller MCU in the electronic device according to the first detecting signal DET at the high voltage level. The microcontroller MCU cuts off the first supply voltage VDD1 of the laser emitter EM according to the interrupt signal. In this way, the fault detector circuit in the embodiment can detect leakage caused by the leakage resistance of 10000 ohms or less.

In addition, in the embodiment, after the sensor in the electronic device operates, the fault detector circuit still continuously detects whether or not a short circuit or leakage occurs in the IC of the sensor. That is, after the laser emitter EM is driven by the first supply voltage VDD1 and the first NMOS transistor N1 is turned on by the control voltage VC, the comparator COM continuously compares the reference voltage Vref with the voltage of the drain of the first NMOS transistor N1, which is equal to the voltage of the node LDR through which the IC of the sensor is connected to the laser emitter EM. When the voltage of the drain of the first NMOS transistor N1 is lower than the reference voltage Vref, the comparator COM generates the first detecting signal DET at a high voltage level, which means that a short circuit or leakage occurs in the IC of the sensor. The digital controller in the IC of the sensor outputs an interrupt signal to the microcontroller MCU in the electronic device according to the first detecting signal DET at the high voltage level. The microcontroller MCU cuts off the first supply voltage VDD1 of the laser emitter EM according to the interrupt signal.

Figure 2:
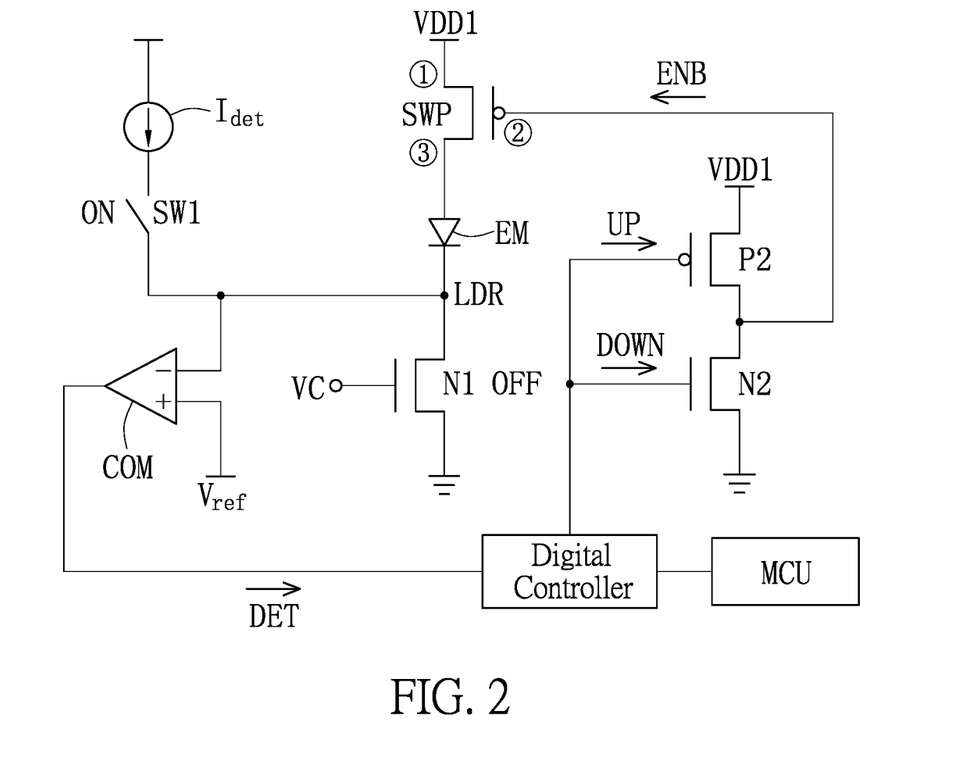
FIG. 2 is a circuit diagram of a fault detector circuit for a laser emitter according to a second embodiment of the present disclosure.

FIG. 2 is a circuit diagram of a fault detector circuit for a laser emitter according to a second embodiment of the present disclosure. A difference between the fault detector circuit in this embodiment and the fault detector circuit shown in FIG. 1 is that, the fault detector circuit in this embodiment further includes a switch transistor SWP, a PMOS transistor P2, and a second NMOS transistor N2. As shown in FIG. 2, a first terminal of the switch transistor SWP is coupled to the first supply voltage VDD1. The drain of the first NMOS transistor N1 is coupled to a third terminal of the switch transistor SWP through the laser emitter EM. A drain of the PMOS transistor P2 and a drain of the second NMOS transistor N2 are coupled to each other and coupled to a second terminal of the switch transistor SWP. A source of the PMOS transistor P2 is coupled to the first supply voltage VDD1. A source of the second NMOS transistor N2 is grounded. A gate of the PMOS transistor P2 and a gate of the second NMOS transistor N2 are coupled to the digital controller. For convenience of description, ①, ②, and ③ are marked in FIG. 2, and respectively represent a first, second, and third terminal of the switch transistor SWP.

In the embodiment, the switch transistor SWP may be a PMOS transistor, the first, second, and third terminal of which are a source, a gate, and a drain respectively.

In comparison with the fault detector circuit shown in FIG. 1, in the embodiment, the comparator COM compares the voltage of the drain of the first NMOS transistor N1 with the reference voltage Vref to output the first detecting signal DET to the digital controller. Therefore, the digital controller generates a pull-up signal UP or a pull-down signal DOWN to turn off or turn on the switch transistor SWP such that a conduction path between the first supply voltage VDD1 and the laser emitter is formed or cut off according to the first detecting signal DET.

Further, when a short circuit or leakage does not occur in the IC of the sensor, the voltage of the node LDR is higher than the reference voltage. Under this condition, the comparator COM compares the voltage of the node LDR with the reference voltage to output the first detecting signal DET at a low voltage level to the digital controller. The digital controller generates the pull-down signal DOWN according to the first detecting signal DET at the low voltage level, such that a control signal ENB at a low voltage level is generated to turn on the switch transistor SWP. The digital controller SWP is a PMOS transistor, which is turned on by the control signal ENB at the low voltage level such that a conduction path is formed between the laser emitter EM and the first supply voltage VDD1.

Conversely, when a short circuit or leakage occurs in the IC of the sensor, the voltage of the node LDR is lower than the reference voltage. Under this condition, the comparator COM compares the voltage of the node LDR with the reference voltage to output the first detecting signal DET at a high voltage level. The digital controller generates the pull-up signal UP according to the first detecting signal DET at the high voltage level, such that the control signal ENB at a high voltage level is generated to turn off the switch transistor SWP. The digital controller SWP that is the PMOS transistor is turned off by the control signal ENB at the high voltage level such that the conduction path between the laser emitter EM and the first supply voltage VDD1 is cut off.

The fault detector circuit in the embodiment and the fault detector circuit shown in FIG. 1 have some differences in terms of circuit architectures and working principles. However, before or after the sensor in the electronic device starts operating, the fault detector circuits in both embodiments are capable of detecting whether or not a short circuit or leakage occurs in the IC of the sensor, and timely stops supplying the first supply voltage VDD1 to the laser emitter EM, thereby preventing a user's eyes being exposed to high energy laser radiation of a laser emitter operating abnormally.

Figure 3:
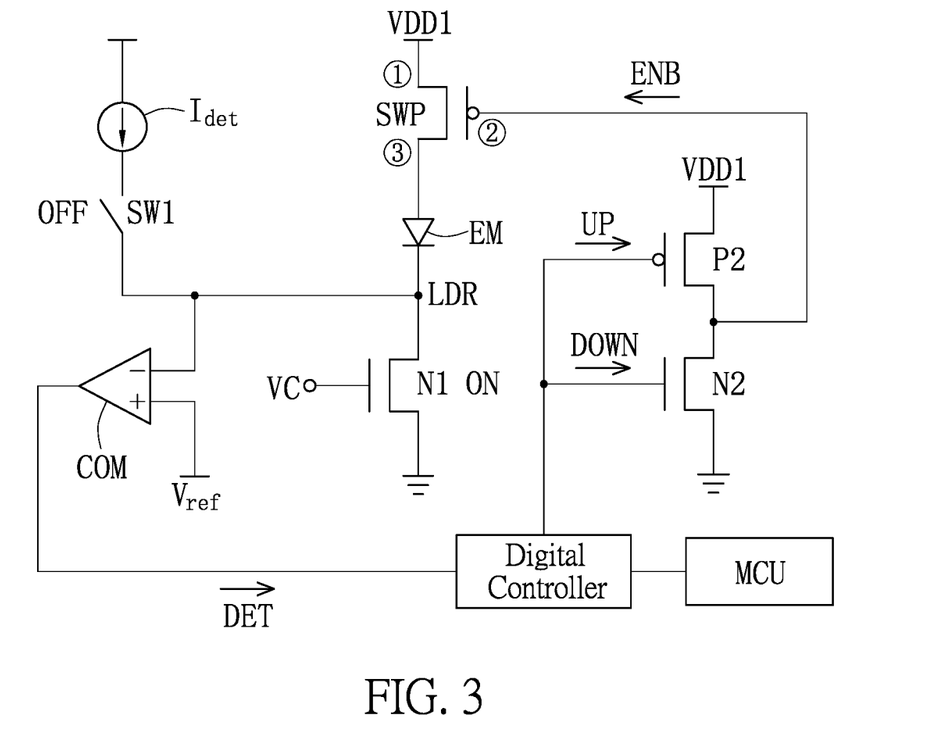
FIG. 3 is a circuit diagram of a fault detector circuit for a laser emitter according to a third embodiment of the present disclosure.

Reference is made to FIG. 3, which is a circuit diagram of a fault detector circuit including the fault detector circuit shown in FIG. 2 according to a third embodiment of the present disclosure.

In the embodiment, the fault detector circuit is not only capable of detecting whether or not a short circuit or leakage occurs in the IC of the sensor in the electronic device, but is also capable of detecting whether or not the switch transistor SWP operates normally. A principle of detecting whether or not the switching transistor SWP is capable of operating normally by the fault detector circuit of the embodiment is further described in the following.

Before the sensor in the electronic device starts operating, the fault detector circuit in the embodiment detects whether or not the switching transistor SWP is capable of operating normally. When the fault detector circuit determines that a short circuit or leakage occurs in the IC of the sensor, the switching transistor SWP must be timely turned off such that the conduction path between the laser emitter EM and the first supply voltage VDD1 is cut off.

Before the laser emitter EM is driven by the first supply voltage VDD1, the first NMOS transistor N1 is turned off and the first switch SW1 is turned on in the second embodiment, but the first NMOS transistor N1 is turned on by the control voltage VC and the first switch SW1 is turned off in the third embodiment. In order to test whether or not the switching transistor SWP is turned off by the control signal ENB, the PMOS transistor P1 is turned on by the pull-up signal UP and the second NMOS transistor N2 is turned off by the pull-down signal DOWN to output the control signal ENB at a high voltage level.

When the switching transistor SWP normally operates and receives the control signal ENB at the high voltage level, the switching transistor SWP is turned off. At this time, the node LDR is equivalent to being grounded and the voltage of the node LDR is a ground voltage. That is, the voltage of the node LDR is zero. Under this condition, the voltage of the drain of the first NMOS transistor N1 is lower than the reference voltage Vref. However, when the switching transistor SWP abnormally operates and receives the control signal ENB at the high voltage level, the switching transistor SWP cannot be turned off normally. At this time, the voltage of the node LDR is equal to the first supply voltage VDD1 minus a voltage across the laser emitter EM, such that the voltage of the drain of the first NMOS transistor N1 is higher than or equal to the reference voltage Vref. Therefore, the comparator COM generates the first detecting signal DET at a low voltage level. The digital controller in the IC of the sensor outputs an interrupt signal to the microcontroller MCU in the electronic device according to the first detecting signal DET at the low voltage level. The microcontroller MCU cuts off the first supply voltage VDD1 of the laser emitter EM according to the interrupt signal.

On the other hand, in order to test whether or not the switching transistor SWP is turned on by the control signal ENB, the PMOS transistor P2 is turned off by the pull-up signal UP and the second NMOS transistor N2 is turned on by the pull-down signal DOWN to output the control signal ENB at a low voltage level.

When the switching transistor SWP normally operates and receives the control signal ENB at the low voltage level, the switching transistor SWP is turned on. At this time, the voltage of the node LDR is equal to the first supply voltage VDD1 minus the voltage across the laser emitter EM. Under this condition, the voltage of the drain of the first NMOS transistor N1 is higher than or equal to the reference voltage Vref. However, when the switching transistor SWP abnormally operates and receives the control signal ENB at the low voltage level, the switching transistor SWP cannot be turned on normally. At this time, the node LDR is equivalent to being grounded and the voltage of the node LDR is a ground voltage such that the voltage of the drain of the first NMOS transistor N1 is lower than the reference voltage Vref. That is, the voltage of the node LDR is zero. Therefore, the comparator COM generates the first detecting signal DET at a high voltage level. The digital controller in the IC of the sensor outputs an interrupt signal to the microcontroller MCU in the electronic device according to the first detecting signal DET at the high voltage level. The microcontroller MCU cuts off the first supply voltage VDD1 of the laser emitter EM according to the interrupt signal.

When detecting whether or not the switching transistor SWP can be turned off normally and the voltage of the node LDR is higher than or equal to the reference voltage, the comparator COM outputs the first detecting signal DET at a low voltage level. The digital controller in the IC of the sensor outputs an interrupt signal to the microcontroller MCU in the electronic device according to the first detecting signal DET at the low voltage level. The microcontroller MCU cuts off the first supply voltage VDD1 of the laser emitter EM according to the interrupt signal. However, when detecting whether or not the switching transistor SWP can be turned off normally and the voltage of the node LDR is lower than the reference voltage, the comparator COM outputs the first detecting signal DET at a high voltage level. The digital controller in the IC of the sensor outputs an interrupt signal to the microcontroller MCU in the electronic device according to the first detecting signal DET at the high voltage level. The microcontroller MCU cuts off the first supply voltage VDD1 of the laser emitter EM according to the interrupt signal.

Figure 4:
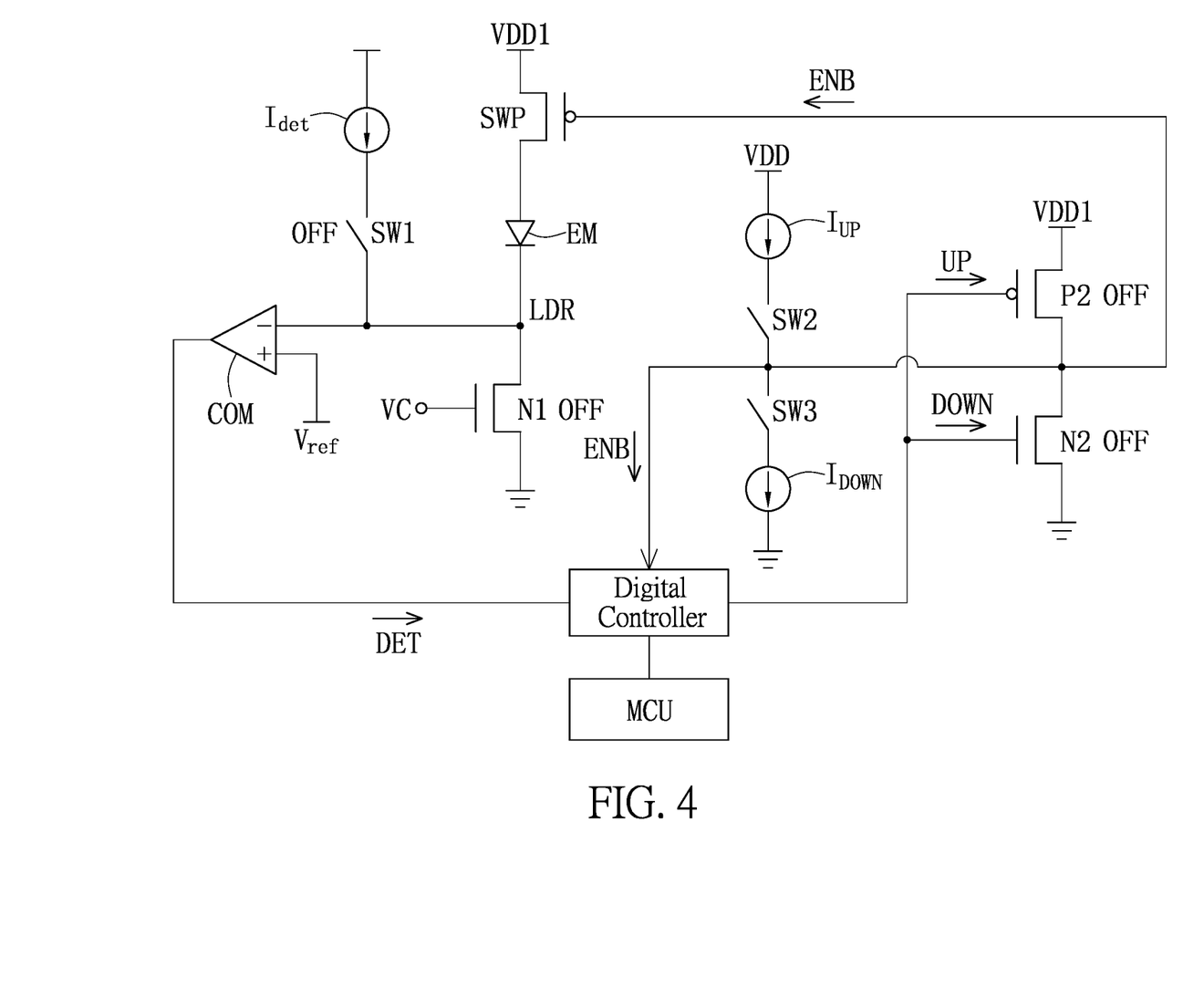
FIG. 4 is a circuit diagram of a fault detector circuit for a laser emitter according to a fourth embodiment of the present disclosure.

Reference is made to FIG. 4, which is a circuit diagram of a fault detector circuit including the fault detector circuit shown in FIG. 3 according to a fourth embodiment of the present disclosure. In the embodiment, the fault detector circuit further includes a pull-up current source IUP and a pull-down current source IDOWN. As shown in FIG. 4, one terminal of the pull-up current source IUP is coupled with the first supply voltage VDD1 and another terminal of the pull-up current source IUP is coupled with the switching transistor SWP through a second switch SW2. One terminal of the pull-down current source IDOWN is coupled with the switching transistor SWP through a third switch SW3 and another terminal of the pull-down current source IDOWN is grounded.

The fault detector circuit in the embodiment and the fault detector circuit shown in FIG. 3 have differences in terms of circuit architectures. Therefore, in comparison with the fault detector circuit shown in FIG. 3, the fault detector circuit in the embodiment is not only capable of detecting whether or not a short circuit or leakage occurs in the IC of the sensor in the electronic device and whether or the switch transistor SWP is capable of operating normally, but is also capable of detecting whether or not the control signal ENB can be controlled. A principle of detecting whether or not the control signal ENB can be normally controlled by the fault detector circuit of the embodiment is further described in the following.

Before the sensor in the electronic device starts operating, the fault detector circuit of the embodiment detects whether or not the control signal ENB can be normally controlled. When the control signal ENB can be normally controlled and a short circuit or leakage occurs in the IC of the sensor, the switching transistor SWP can be timely turned off by the control signal ENB such that the conduction path between the laser emitter EM and the first supply voltage VDD1 is cut off.

Before the laser emitter EM is driven by the first supply voltage VDD1, the first NMOS transistor N1 is turned off by the control voltage VC. In addition, the PMOS transistor P2 is turned off by the pull-up signal UP and the second NMOS transistor N2 is turned off by the pull-down signal DOWN. In the embodiment, whether or not a short circuit occurs between the control signal ENB and the first supply voltage VDD1 and whether or not a short circuit occurs between the control signal ENB and a ground terminal are detected to test whether or not the control signal ENB is controlled normally.

Further, when whether or not a short circuit occurs between the control signal ENB and the first supply voltage VDD1 is detected, the second switch SW2 is turned off and the third switch SW3 is turned on. At this time, if the short circuit does not occur between the control signal ENB and the first supply voltage VDD1, a voltage of the control signal ENB is reduced to a ground voltage. That is, the voltage of the control signal ENB is zero. Conversely, if the short circuit occurs between the control signal ENB and the first supply voltage VDD1, the voltage of the control signal ENB is equal to the first supply voltage VDD1. Therefore, when whether or not the short circuit occurs between the control signal ENB and the first supply voltage VDD1 is detected, and the voltage of the control signal ENB received by the digital controller is equal to the first supply voltage VDD1, the digital controller outputs an interrupt signal to the microcontroller MCU in the electronic device. The microcontroller MCU cuts off the first supply voltage VDD1 of the laser emitter EM according to the interrupt signal.

On the other hand, when whether or not the short circuit occurs between the control signal ENB and the ground terminal is detected, the second switch SW2 is turned on and the third switch SW3 is turned off. At this time, if the short circuit does not occur between the control signal ENB and the ground terminal, the voltage of the control signal ENB increases to be equal to the first supply voltage VDD1. Conversely, if a short circuit occurs between the control signal ENB and the ground terminal, the voltage of the control signal ENB is equal to be a ground voltage. That is, the voltage of the control signal ENB is zero. Therefore, when whether or not a short circuit occurs between the control signal ENB and the ground terminal is detected, and the voltage of the control signal ENB received by the digital controller is zero, the digital controller outputs an interrupt signal to the microcontroller MCU in the electronic device. The microcontroller MCU cuts off the first supply voltage VDD1 of the laser emitter EM according to the interrupt signal.

In summary, before the sensor in the electronic device starts to operate, the fault detector circuit of the present disclosure is capable of detecting whether or not a short circuit or leakage occurs in the IC of the sensor in the electronic device, detecting whether or not the switch transistor SWP operates normally, and detecting whether or not the control signal ENB is controlled normally. Further, when the sensor in the electronic device starts operating, the fault detector circuit of the present disclosure is still capable of detecting whether or not a short circuit or leakage occurs in the IC of the sensor in the electronic device.

When the IC in the sensor is found to be unable to operate normally due to the above-mentioned conditions, the fault detector circuit of present disclosure cuts off the first supply voltage of the laser emitter by using the microcontroller of the electronic device or the switch transistor disposed in the fault detector circuit. As a result, the fault detector circuit of the present disclosure can effectively prevent from the user's eyes being damaged by a laser emitter operating abnormally after the sensor in the electronic device is driven.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A fault detector circuit for detecting an optical sensor which works with a laser emitter in an electronic device, and the fault detector circuit comprises:
   a first NMOS transistor having a drain coupled to a first supply voltage through the laser emitter, a gate coupled to a control voltage, and a source grounded; and
   a comparator having an inverting terminal coupled to the drain of the first NMOS transistor and a non-inverting terminal coupled to a reference voltage;
   wherein before the laser emitter is driven by the first supply voltage, the first NMOS transistor is turned off by the control voltage, and the comparator compares a voltage of the drain of the first NMOS transistor with the reference voltage to generate a first detecting signal for determining whether or not the first supply voltage of the laser emitter needs to be cut off.

2. The fault detector circuit of claim 1, further comprising:
   a first current source coupled to the drain of the first NMOS transistor through a first switch;
   wherein before the laser emitter is driven by the first supply voltage, the first switch is turned on such that the first current source provides a current to the drain of the first NMOS transistor.

3. The fault detector circuit of claim 1, wherein when the voltage of the drain of the first NMOS transistor is lower than the reference voltage, the comparator generates the first detecting signal at a high voltage level such that a digital controller in the fault detector circuit outputs an interrupt signal to a microcontroller in the electronic device according to the first detecting signal to cut off the first supply voltage of the laser emitter.

4. The fault detector circuit of claim 3, wherein after the laser emitter is driven by the first supply voltage, the first NMOS transistor is turned on by the control voltage; wherein the comparator continually compares the voltage of the drain of the first NMOS transistor with the reference voltage, and when the voltage of the drain of the first NMOS transistor is lower than the reference voltage, the comparator generates the first detecting signal at the high voltage level, such that the digital controller included in the electronic device cuts off the first supply voltage of the laser emitter via the microcontroller included in the electronic device according to the first detecting signal.

5. The fault detector circuit of claim 3, further comprising:
   a first current source coupled to the drain of the first NMOS transistor through a first switch;
   wherein before the laser emitter is driven by the first supply voltage, the first switch is turned on such that the first current source provides a current to the drain of the first NMOS transistor.

6. A fault detector circuit for detecting an optical sensor which works with a laser emitter in an electronic device, and the fault detector circuit comprises:

a switch transistor having a first terminal coupled to a first supply voltage, and a second terminal coupled to a digital controller;

a first NMOS transistor having a drain coupled to a third terminal of the switch transistor through the laser emitter, a gate coupled to a control voltage, and a source grounded; and a comparator having an inverting terminal coupled to the drain of the first NMOS transistor and a non-inverting terminal coupled to a reference voltage;

wherein before the laser emitter is driven by the first supply voltage, the first NMOS transistor is turned off by the control voltage, the comparator compares a voltage of the drain of the first NMOS transistor with the reference voltage to generate a first detecting signal, and the digital controller connected to the comparator outputs a control signal to the switch transistor and the first NMOS transistor to turn on or turn off the switch transistor and the first NMOS transistor according to the first detecting signal.

7. The fault detector circuit of claim 6, further comprising:
a first current source coupled to the drain of the first NMOS transistor through a first switch;
wherein before the laser emitter is driven by the first supply voltage, the first switch is turned on such that the first current source provides a current to the drain of the first NMOS transistor.

8. The fault detector circuit of claim 6, further comprising:
a PMOS transistor and a second NMOS transistor, wherein a drain of the PMOS transistor is coupled to a drain of the second NMOS transistor, a source of the PMOS transistor is coupled to the first supply voltage, a source of the second NMOS transistor is grounded, a gate of the PMOS transistor is coupled to a pull-up signal, and a gate of the second NMOS transistor is coupled to a pull-down signal.

9. The fault detector circuit of claim 6, wherein when the voltage of the drain of the first NMOS transistor is lower than the reference voltage, the comparator generates the first detecting signal at a high voltage level such that the digital controller outputs the control signal at a high voltage level to the switch transistor to turn off the switch transistor.

10. The fault detector circuit of claim 9, wherein after the laser emitter is driven by the first supply voltage, the first NMOS transistor is turned on by the control voltage, the comparator continually compares a voltage of a third terminal of the first NMOS transistor with the reference voltage, and when the voltage of the third terminal of the first NMOS transistor is lower than the reference voltage, the comparator generates the first detecting signal at the high voltage level such that the digital controller outputs the control signal at the high voltage level to the switch transistor to turn off the switch transistor.

11. The fault detector circuit of claim 9, further comprising:

a first current source coupled to the drain of the first NMOS transistor through a first switch;
wherein before the laser emitter is driven by the first supply voltage, the first switch is turned on such that the first current source provides a current to the drain of the first NMOS transistor.

12. The fault detector circuit of claim 9, further comprising:
a PMOS transistor and a second NMOS transistor, wherein a drain of the PMOS transistor is coupled to a drain of the second NMOS transistor, a source of the PMOS transistor is coupled to the first supply voltage, a source of the second NMOS transistor is grounded, a gate of the PMOS transistor is coupled to a pull-up signal, and a gate of the second NMOS transistor is coupled to a pull-down signal.

13. The fault detector circuit of claim 11, wherein when the voltage of the drain of the first NMOS transistor is lower than the reference voltage, the comparator generates the first detecting signal at the high voltage level, and the digital controller accordingly generates the pull-up signal to turn off the switch transistor such that a conduction path between the laser emitter and the first supply voltage is cut off;
wherein when the voltage of the drain of the first NMOS transistor is higher than the reference voltage, the comparator generates the first detecting signal at a low voltage level, and the digital controller accordingly generates the pull-down signal to turn on the switch transistor such that the conduction path between the laser emitter and the first supply voltage is formed.

14. The fault detector circuit of claim 11, further comprising:
a pull-up current source, wherein one terminal of the pull-up current source is coupled to the first supply voltage and another terminal of the pull-up current source is coupled to the switch transistor through a second switch; and
a pull-down current source, wherein one terminal of the pull-down current source is coupled to the switch transistor through a third switch and another terminal of the pull-down current source is grounded.

15. The fault detector circuit of claim 13, wherein when the second switch is turned on and the third switch is turned off, and when the digital controller detects that a voltage of the control signal is zero, a microcontroller in the electronic device cuts off the first supply voltage of the laser emitter; and
wherein when the second switch is turned off and the third switch is turned on, and when the digital controller detects that the voltage of the control signal is equal to the first supply voltage, the microcontroller in the electronic device cuts off the first supply voltage of the laser emitter.

* * * * *